(12) United States Patent
Kuo et al.

(10) Patent No.: US 11,973,018 B2
(45) Date of Patent: Apr. 30, 2024

(54) ELECTRONIC PACKAGE

(71) Applicant: Advanced Semiconductor Engineering, Inc., Kaohsiung (TW)

(72) Inventors: Chiung-Ying Kuo, Kaohsiung (TW); Hung-Chun Kuo, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 152 days.

(21) Appl. No.: 17/668,237

(22) Filed: Feb. 9, 2022

(65) Prior Publication Data
US 2023/0253305 A1 Aug. 10, 2023

(51) Int. Cl.
*H01L 23/50* (2006.01)
*H01L 23/31* (2006.01)
*H01L 23/498* (2006.01)

(52) U.S. Cl.
CPC .......... *H01L 23/50* (2013.01); *H01L 23/3107* (2013.01); *H01L 23/49816* (2013.01)

(58) Field of Classification Search
CPC ................. H01L 23/50; H01L 23/3107; H01L 23/49816
See application file for complete search history.

(56) References Cited

U.S. PATENT DOCUMENTS

| | | | | |
|---|---|---|---|---|
| 2005/0248015 | A1* | 11/2005 | Palanduz | H05K 1/0231 |
| | | | | 257/E23.079 |
| 2014/0225246 | A1* | 8/2014 | Henderson | H01L 23/5384 |
| | | | | 257/691 |
| 2020/0196448 | A1* | 6/2020 | Punjabi | H05K 1/115 |
| 2020/0243448 | A1* | 7/2020 | Qian | H01L 21/4853 |
| 2021/0202392 | A1 | 7/2021 | Kung et al. | |
| 2023/0097714 | A1* | 3/2023 | Lambert | H01L 23/5385 |
| | | | | 257/776 |

* cited by examiner

*Primary Examiner* — Peniel M Gumedzoe
(74) *Attorney, Agent, or Firm* — FOLEY & LARDNER LLP

(57) ABSTRACT

An electronic package is provided. The electronic package includes a power regulating component, an electronic component, and a circuit structure. The circuit structure separates the power regulating component and the electronic component. The circuit structure is configured to provide a first power to the power regulating component. The power regulating component is configured to provide a second power to the electronic component through the circuit structure.

13 Claims, 9 Drawing Sheets

ELECTRONIC PACKAGE

BACKGROUND

1. Technical Field

The present disclosure relates generally to an electronic package.

2. Description of the Related Art

System-in-Package (SiP) technology leverages integrated circuit (IC) assembly capabilities, including wafer level packaging, fan-out wafer level packaging, 2.5D/3D IC, etc., to integrate multiple chips or components into a package.

A power transmission path is usually provided by a substrate and/or package routing features (such as conductive vias, conductive pads, and/or conductive wires) in the package. A long power routing path through the substrate may cause a significant voltage drop and degrade the performance thereof. When input voltage decreases, voltage drops may become an issue.

SUMMARY

In some embodiments, an electronic package includes a power regulating component, an electronic component, and a circuit structure. The circuit structure separates the power regulating component and the electronic component. The circuit structure is configured to provide a first power to the power regulating component. The power regulating component is configured to provide a second power to the electronic component through the circuit structure.

In some embodiments, an electronic package includes a carrier and an electronic component. The carrier includes a plurality of non-power vias and a plurality of power vias around the non-power vias. The electronic component is over the non-power vias.

In some embodiments, an electronic package includes a carrier and an electronic component. The carrier includes a power routing region. The electronic component is embedded in the carrier. The electronic component has an active surface and a passive surface opposite to the active surface. The power routing region is configured to provide a power path electrically connected to the passive surface of the electronic component.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

DETAILED DESCRIPTION

Figure 1:
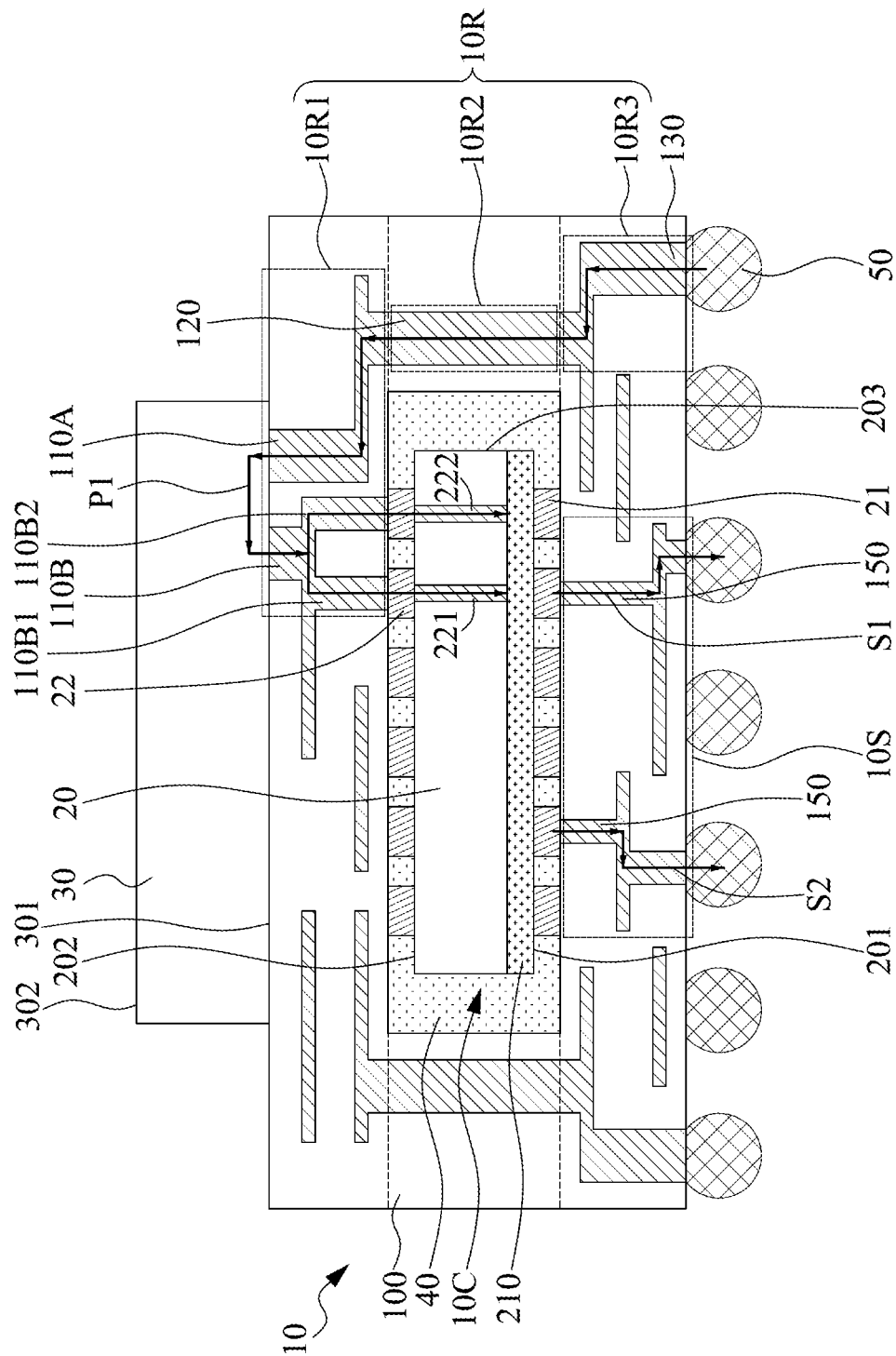
FIG. 1 is a cross-section of an electronic package in accordance with some embodiments of the present disclosure.

FIG. 1 is a cross-section of an electronic package 1 in accordance with some embodiments of the present disclosure. The electronic package 1 includes a carrier 10, an electronic component 20, a power regulating component 30, a protective element 40, and electrical contacts 50.

The carrier 10 may include a surface 101 (also referred to as "an upper surface") and a surface 102 (also referred to as "a bottom surface") opposite to the surface 101. The carrier 10 may include, for example, a printed circuit board, such as a paper-based copper foil laminate, a composite copper foil laminate, or a polymer-impregnated glass-fiber-based copper foil laminate. The carrier 10 may include a multi-layer substrate which includes a core layer and one or more conductive materials and/or structures disposed on an upper surface and a bottom surface of the carrier 10. The carrier 10 may include an interconnection structure, such as a plurality of conductive traces and/or a plurality of through vias. In some embodiments, the carrier 10 may include one or more circuit structures. In some embodiments, the carrier 10 may include one or more conductive layers or structures (also referred to as "redistribution layers or structures" or "wiring layers or structures") and one or more dielectric layers stacked on each other. The conductive layers or structures may be or include Au, Ag, Al, Cu, or an alloy thereof. In some embodiments, each of the dielectric layers may be or include a dielectric laminate. The dielectric laminate may be or include a bismaleimide triazine (BT) laminate, an ABF laminate, or the like. The dielectric laminate may include fillers or glass fibers. The conductive layers or structures may include conductive through vias (e.g., power vias 110A, 110B, 110B1, 110B2, 120, 130, and 130A, and non-power vias 150 and 150A, which will be discussed hereinafter) passing through and embedded in the one or more dielectric layers or dielectric laminates (e.g., a base layer 100, which will be discussed hereinafter) of the carrier 10. The dielectric laminates may serve as reinforcing layers for the carrier 10. In some embodiments, the carrier 10 (or the circuit structure) separates the power regulating component 30 and the electronic component 20.

The electronic component 20 may be embedded in the carrier 10 (or the circuit structure). In some embodiments, the electronic component 20 is fully embedded in the carrier 10 (or the circuit structure). The electronic component 20 may have an active surface 201, a passive surface 202 opposite to the active surface, and a lateral surface 203 (also referred to as "a lateral side") angled with the passive surface 202. The lateral surface 203 may extend between the active surface 201 and the passive surface 202. In some embodiments, the electronic component 20 includes one or more conductive pads 21 on the active surface 202 and one or more conductive pads 22 on the passive surface 202. In some embodiments, a signal (or an electrical signal) may be transmitted through the active surface 201. For example, electronic component 20 may include an active element 210 (e.g., a circuit region) adjacent to the active surface 201. The active element 210 may be configured to transmit a signal to the carrier 10 and/or to receive a signal from the carrier 10. In some embodiments, the electronic component 20 may include one or more conductive through vias (e.g., conductive through vias 221 and 222) extending between the active surface 201 and the passive surface 202. The conductive through vias 221 and 222 may provide electrical connections between the active surface 201 and the passive surface 202 of the electronic component 20.

In some embodiments, the electronic component 20 may be a circuit or a circuit element that relies on an external power supply to control or modify electrical signals. For example, the electronic component 20 may include a processor, a controller, a memory, or an input/output (I/O) buffer, etc. In some embodiments, the electronic component 20 may include, for example, a central processing unit (CPU), a microprocessor unit (MPU), a graphics processing unit (GPU), a microcontroller unit (MCU), an application-specific integrated circuit (ASIC), a field-programmable gate array (FPGA), or another type of integrated circuit.

In some embodiments, the carrier 10 (or the circuit structure) is configured to provide a power (also referred to as "a first power") to the power regulating component 30, and the power regulating component 30 is configured to provide a power (also referred to as "a second power") to the electronic component through the carrier 10 (or the circuit structure). In some embodiments, the carrier 10 includes a power routing region 10R and a signal routing region 10S. In some embodiments, the power routing region 10R is configured to provide a power path (e.g., a power path P1) passing the electronic component 20. In some embodiments, the signal routing region 10S is configured to provide a signal path (e.g., signal paths S1 and S2) to the electronic component 20. In some embodiments, the power routing region 10R and the signal routing region 10S are each formed of a portion of the conductive layers or structures of the carrier 10. For example, the power routing region 10R and the signal routing region 10S each may include a portion of the conductive through vias embedded in one or more dielectric layers or laminates of the carrier 10. In some embodiments, the power routing region 10R and the signal routing region 10S are embedded in a base layer 100 of the carrier 10. The base layer 100 may include one or more dielectric layers or laminates.

As used herein, a signal path may refer to a path through which an electrical signal may be transmitted. Such an electrical signal may include either analog or digital signals. Additionally, a power path, as used and described herein, may refer to a path dedicated to power supply connections.

In some embodiments, the power routing region 10R is configured to provide a power path P1 passing the passive surface 202 of the electronic component 20. In some embodiments, the power path P1 electrically connects to the passive surface 202 of the electronic component 20. In some embodiments, an external circuit region (not shown in drawings) may be configured to provide a power to the electronic component 20 through the power path P4. In some embodiments, the power path P1 from the power regulating component 30 to the electronic component 20 passes the passive surface 202 of the electronic component 20. In some embodiments, the power path P1 passes from the passive surface 202 to the active surface 201 of the electronic component 20. In some embodiments, the power path P1 further extends along the lateral surface 203 (or the lateral side) of the electronic component 20 and passes through the power regulating component 30. In some embodiments, the power path P1 is configured to carry the power (or the first power) from the carrier 10 (or the circuit structure) to the power regulating component 30. In some embodiments, the power routing region 10R includes a plurality of power vias (e.g., power vias 120 and 130) around the electronic component 20 and configured to provide electromagnetic shielding. In some embodiments, the power vias of the power routing region 10R are embedded in and penetrate the base layer 100 (e.g., including one or more dielectric layers or laminates) of the carrier 10.

The power routing region 10R may include a portion 10R1 over the electronic component 20. In some embodiments, the portion 10R1 is between the power regulating component 30 and the electronic component 20. In some embodiments, the portion 10R1 of the power routing region 10R electrically connects the power regulating component 30 and the passive surface 202 of the electronic component 20. In some embodiments, the carrier 10 is configured to provide the power path P1 and provide a power to the passive surface 202 of the electronic component 20 through the portion 10R1 of the carrier. In some embodiments, the portion 10R1 of the power routing region 10R partially overlaps the electronic component 20 from a top view perspective. In some embodiments, the electronic component 20 separates the portion 10R1 of the power routing region 10R from the signal routing region 10S. In some embodiments, the electronic component 20 is stacked between the portion 10R1 of the power routing region 10R and the signal routing region 10S.

In some embodiments, the portion 10R1 of the power routing region 10R includes a plurality of power vias (e.g., power vias 110A, 110B, 110B1, and 110B2). In some embodiments, a portion of the power vias (the power vias 110A, 110B, 110B1, and 110B2) may be over the electronic component 20 and configured to provide a power to the electronic component 20 through the passive surface 202 of the electronic component 20. In some embodiments, the portion 10R1 of the power routing region 10R may include two groups of power vias providing different electrical connection functions. In some embodiments, the power via 110A (also referred to as "a first group of the power vias") is electrically connected to the power regulating component 30. In some embodiments, the power via 110A partially overlaps the electronic component 20 from a top view perspective. In some other embodiments, the power via 110A may be free from overlapping the electronic component 20 from a top view perspective. In some embodiments, the power vias 110B, 110B1, and 110B2 (also referred to as "a second group of the power vias") electrically connect the power regulating component 30 and the passive surface 202 of the electronic component 20. In some embodiments, the power vias 110B, 110B1, and 110B2 overlap the electronic component 20 from a top view perspective. In some embodiments, the power vias 110A, 110B, 110B1, and 110B2 of the portion 10R1 are embedded in and penetrate a portion of the base layer 100 (e.g., including one or more dielectric layers or laminates) of the carrier 10.

The power routing region 10R may further include a portion 10R2 connected to the portion 10R1. In some embodiments, the portion 10R2 is around the electronic component 20. In some embodiments, the portion 10R2 of the power routing region 10R extends along the lateral surface 203 of the electronic component 20. In some embodiments, the power via 110A of the portion 10R1 electrically connects the power regulating component 30 and the portion 10R2 of the power routing region 10R. In some embodiments, the portion 10R2 of the power routing region 10R surrounds the electronic component 20. In some embodiments, the portion 10R2 the power routing region 10R includes one or more power vias (e.g., a power via 120) electrically connected to the power via 110A of the portion 10R1. In some embodiments, the one or more power vias (e.g., the power via 120) extends along the lateral surface 203 (or the lateral side) of the electronic component 20. In some embodiments, the electronic component 20 is surrounded by one or more power vias (e.g., the power vias 120). In some embodiments, the power via 120 of the portion 10R2 is embedded in and penetrates a portion of the base layer 100 (e.g., including one or more dielectric layers or laminates) of the carrier 10.

The power routing region 10R may further include a portion 10R3 below the electronic component 20. In some embodiments, the portion 10R3 supports the portion 10R2 and the electronic component 20. In some embodiments, the portion 10R3 is disposed adjacent to the active surface 201 of the electronic component 20. In some embodiments, the portion 10R3 is electrically connected to the portion 10R2. In some embodiments, the portion 10R2 electrically connects the portion 10R1 to the portion 10R3. In some embodiments, the portion 10R3 the power routing region 10R includes one or more power vias (e.g., a power via 130) electrically connected to the power via 120 of the portion 10R2. In some embodiments, the power via 130 is free from overlapping the electronic component 20 from a top view perspective. In some embodiments, the power via 130 is located at a peripheral region with respect to the signal routing region 10S. In some embodiments, the power via 130 is embedded in and penetrates a portion of the base layer 100 (e.g., including one or more dielectric layers or laminates) of the carrier 10.

The signal routing region 10S may be disposed adjacent to the active surface 201 of the electronic component 20. In some embodiments, the signal routing region 10S is configured to provide one or more signal paths (e.g., signal paths S1 and S2) to the active surface 201 of the electronic component 20. In some embodiments, an external circuit region (not shown in drawings) may be configured to transmit a signal to the electronic component 20 and/or receive a signal from the electronic component 20 through the signal path S1 and/or S2. In some embodiments, the signal routing region 10S includes one or more non-power vias 150. In some embodiments, the non-power vias 150 may be or include signal vias. In some embodiments, the electronic component 20 are over the non-power vias 150. In some embodiments, the power vias 130 are around the non-power vias 150. In some embodiments, the non-power vias 150 are disposed directly under the active surface 201 of the electronic component 20 and surrounded by the power vias 130. In some embodiments, the signal routing region 10S overlaps the electronic component 20 from a top view perspective. In some embodiments, the non-power vias 150 overlap the electronic component 20 from a top view perspective. In some embodiments, the non-power vias 150 are embedded in and penetrate a portion of the base layer 100 (e.g., including one or more dielectric layers or laminates) of the carrier 10.

In some embodiments, the carrier 10 (or the circuit structure) may further include a cavity 10C for accommodating the electronic component 20. In some embodiments, the cavity 10C is between the signal routing region 10S and the portion 10R1 of the power routing region 10R. In some embodiments, the portion 10R2 of the power routing region 10R defines the cavity 10C. In some embodiments, the portion 10R2 of the power routing region 10R surrounds the cavity 10C. In some embodiments, the power via 120 is spaced apart from the cavity 10C by a portion of the base layer 100.

In some embodiments, the carrier 10 including the cavity 10C may be formed by the following operations. A plurality of conductive layers or structures and a plurality of dielectric laminates may be stacked on each other to form a multi-layer composite structure (e.g., including the power vias 120 and 130 and a portion of the base layer 100) (also referred to as "a first laminated substrate"), and a portion of the multi-layer composite structure (or the first laminated substrate) may be removed to form the cavity 10C exposed by an upper surface of the multi-layer composite structure. Then, one or more conductive layers or structures and one or more dielectric laminates may be stacked on each other to form another multi-layer composite structure (e.g., including the power vias 110A, 110B, 110B1, and 110B2 and a portion of the base layer 100) (also referred to as "a second laminated substrate"). Next, after the electronic component 20 is disposed in the cavity 10C, the two multi-layer composite structures (i.e., the first laminated substrate and the second laminated substrate) may be laminated to each other to form the carrier 10 with the electronic component 20 embedded therein.

The power regulating component 30 may be disposed adjacent to the carrier 10. In some embodiments, the carrier 10 (or the circuit structure) is located outside of the power regulating component 30. In some embodiments, the power regulating component 30 has an active surface 301 and a passive surface 302 opposite to the active surface 301, and the carrier 10 (or the circuit structure) is located outside of the active surface 301 of the power regulating component 30. In some embodiments, the power regulating component 30 is disposed over the surface 101 (or the upper surface) of the carrier 10. In some embodiments, the power regulating component 30 is disposed over the portion 10R1 of the power routing region 10R. In some embodiments, the power regulating component 30 is disposed adjacent to the passive surface 202 of the electronic component 20. In some embodiments, the power regulating component 30 and the electronic component 20 partially overlap from a top view perspective. In some embodiments, the portion 10R1 of the power routing region 10R is stacked between the power regulating component 30 and the electronic component 20. In some embodiments, the power regulating component 30 overlaps the signal routing region 10S from a top view perspective.

In some embodiments, the power regulating component 30 may include a power management integrated circuit (PMIC). The power regulating component 30 may be configured to provide one or more types of power control to one or more electronic components of the electronic package 1. For example, the power regulating component 30 may be configured to provide regulated power to the electronic component 20. For example, the power regulating component 30 may be configured to provide one or various different output voltages to the electronic component 20. In some embodiments, the power regulating component 30 may include a voltage regulator, such as a linear regulator (which is configured to maintain a constant output voltage) or a switching regulator (which is configured to generate an output voltage higher than or lower than the input voltage).

In some embodiments, the power regulating component 30 may include a step-down (buck) converter, a step-up (boost) converter, an analog-to-digital converter, a digital-to-analog converter, an AC-DC converter, a DC-DC converter, other types of converters, or a combination thereof. In some embodiments, the power regulating component 30 may further include one or more inductance devices (or inductors) and one or more capacitance device (or capacitors) integrated with the voltage regulator and/or the converter. Other examples of passive devices may include, for example, resistors, diodes, fuses or antifuses, etc., and may be included along with the inductance devices and the capacitance device within the power regulating component 30. In some embodiments, the power regulating component 30 may be a thin film-type component.

Supply power may be transmitted to the power regulating component 30 as an input power (or an input voltage) through the power path P1 provided by the carrier 10. The power regulating component 30 may receive the input power, regulate the input power, and then provide an output power (or an output voltage) to the electronic component 20 through the power path P1 provided by the carrier 10.

In some embodiments, the power path P1 passes through the portion 10R3 of the power routing region 10R, the portion 10R2 of the power routing region 10R, the portion 10R1 of the power routing region 10R, the power regulating component 30, the portion 10R1 of the power routing region 10R, the passive surface 202 of the electronic component 20, the conductive through via 221 and/or 222, and then the active surface 201 of the electronic component 20. In some embodiments, the power path P1 passes through the power via 130, the power via 120, the power via 110A, the power regulating component 30, the power via 110B1 and/or 110B2, the passive surface 202 of the electronic component 20, the conductive through via 221 and/or 222, and then the active surface 201 of the electronic component 20.

The protective element 40 may be disposed in the cavity 10C of the carrier 10. In some embodiments, the protective element 40 covers or encapsulates the electronic component 20. In some embodiments, the protective element 40 contacts the active surface 201 and the passive surface 202 of the electronic component 20. In some embodiments, the protective element 40 covers or encapsulates the conductive pads 21 and 22. In some embodiments, the power via 120 of the power routing region 10R is spaced apart from the protective element 40. In some embodiments, the power via 120 of the power routing region 10R is spaced apart from the protective element 40 by a portion of the base layer 100. In some embodiments, the protective element 40 includes a dielectric material, an encapsulating material, or a combination thereof. The dielectric material may include pre-impregnated composite fibers (e.g., pre-preg), borophosphosilicate glass (BPSG), silicon oxide, silicon nitride, silicon oxynitride, undoped Silicate Glass (USG), any combination of two or more thereof, or the like. Examples of a pre-preg may include, but are not limited to, a multi-layer structure formed by stacking or laminating a number of pre-impregnated materials/sheets. The encapsulating material may include an epoxy resin including fillers, a molding compound (e.g., an epoxy molding compound or other molding compound), polyimide, a phenolic compound or material, a material including a silicone dispersed therein, or a combination thereof.

The electrical contacts 50 may be disposed on the surface 102 (or the bottom surface) of the carrier 10. The electrical contacts 50 may provide electrical connections between the electronic package 1 and external components (e.g. external circuits or circuit boards). In some embodiments, the carrier 10 is configured to be electrically connected to a power source or a power supply (not illustrated in the figures) through the electrical contacts 50. In some embodiments, the electrical contacts 50 include controlled collapse chip connection (C4) bumps, a ball grid array (BGA), or a land grid array (LGA).

Currently, a power regulating component (e.g., a PMIC) and an electronic component are usually disposed on a substrate (e.g., a PCB) side-by-side, and between which the electrical connection may be attained by an interconnection structure within the substrate. Due to the relatively long distance between the power regulating component the electronic component, the transmission path of the interconnection structure between the power regulating component the electronic component is relatively long. Therefore, a relatively high supply power is required, and additional heat may be generated, resulting in a possible power loss and even fail in function. In addition, I/O terminals for electrical signals and power are both disposed on the active surface of an electronic component, thus the input power may interfere the electrical signals and adversely affect the qualities and characteristics of the electrical signals, and the I/O terminals for power occupying a portion of the active surface of the electronic component also reduce the area for the I/O terminals for electrical signals.

According to some embodiments of the present disclosure, the electronic component 20 is embedded in the carrier 10, the signal is transmitted through the active surface of the electronic component 20, and the power is transmitted through the passive surface of the electronic component 20. Therefore, the length of the power path (e.g., the length of the power path between the electronic component 20 and the power regulating component 30) can be significantly reduced, and the interferences between the power and the signal can be significantly reduced as well.

In addition, according to some embodiments of the present disclosure, the power regulating component 30 is disposed relatively close to where the power is transmitted through. Therefore, the power loss can be reduced, and the stability of the input power and the output power can be increased.

Moreover, according to some embodiments of the present disclosure, the power routing region 10R is formed of a portion of the conductive layers or structures of the carrier 10 rather than bonding wires or conductive pillars or posts encapsulated by an encapsulant. Thus, the power path P1 can pass through the conductive layers or structures originally formed within the carrier 10, and additional conductive structures such as bonding wires or molded conductive pillars and/or posts are not required. Therefore, additional structures for the power path P1 is not required, and the manufacturing process can be simplified.

Figure 2A:
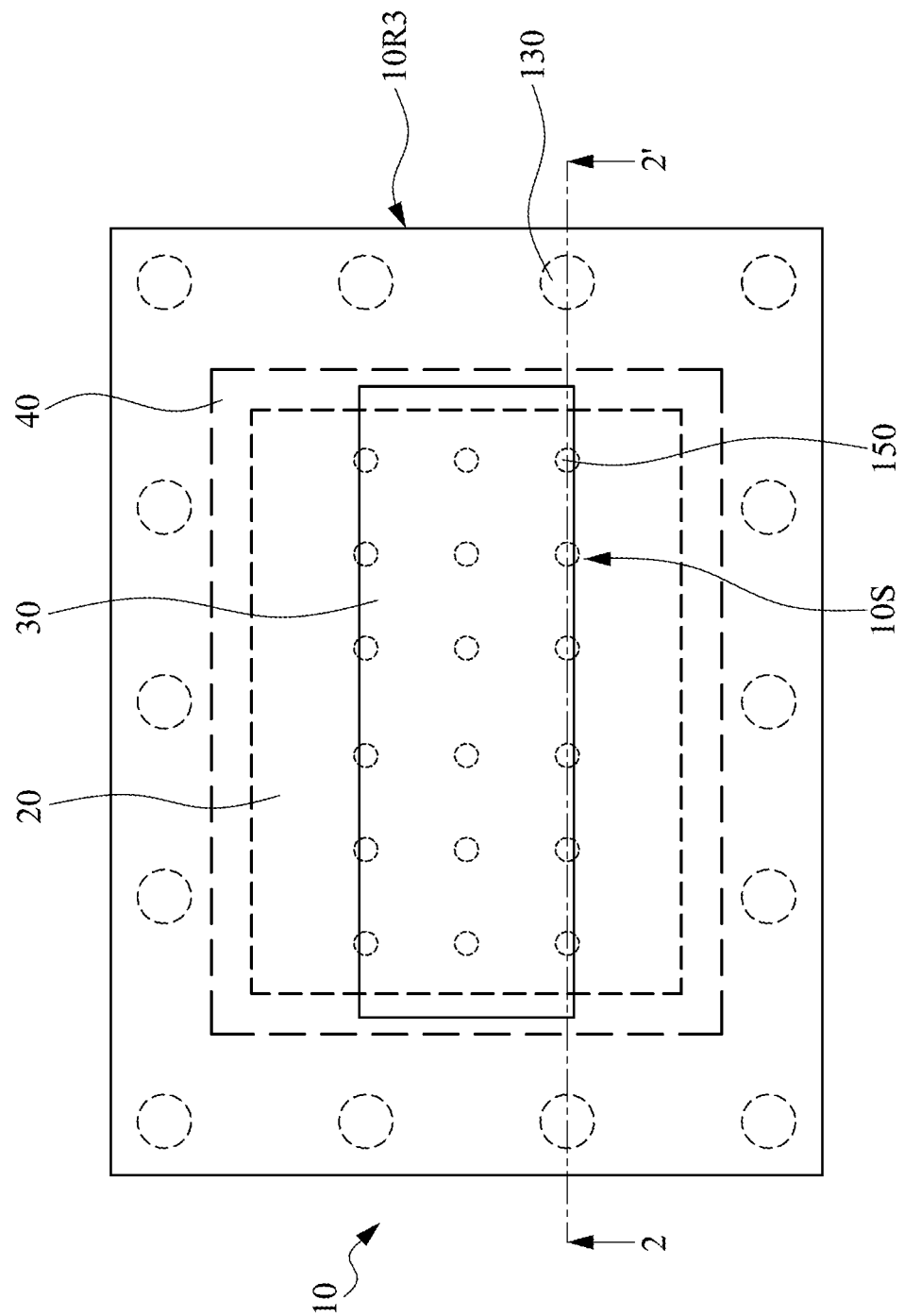
FIG. 2A is a top view of an electronic package in accordance with some embodiments of the present disclosure.

FIG. 2A is a top view of an electronic package 1 in accordance with some embodiments of the present disclosure. In some embodiments, FIG. 2A shows a top view of the electronic package 1 illustrated in FIG. 1. In some embodiments, FIG. 1 is a cross-section along the cross-sectional line 2-2' in FIG. 2A. It should be noted that some elements are omitted from FIG. 2A for clarity.

In some embodiments, the portion 10R3 of the power routing region 10R includes a plurality of power vias 130. In some embodiments, the signal routing region 10S includes a plurality of non-power vias 150. In some embodiments, the power vias 130 are located at a peripheral region with respect to the non-power vias 150. In some embodiments, the power vias 130 surround the non-power vias 150.

In some embodiments, the non-power vias 150 are located within a projection of the electronic component 20. In some embodiments, one or some of the non-power vias 150 are located within a projection of the power regulating component 30. In some embodiments, the non-power vias 150 are located within a projection of the protective element 40. In some embodiments, the power vias 130 are located outside of a projection of the electronic component 20. In some embodiments, the power vias 130 are located outside of a projection of the power regulating component 30. In some embodiments, the power vias 130 are located outside of a projection of the protective element 40.

According to some embodiments of the present disclosure, the power vias 130 are located on a peripheral region of the carrier 10, and thus the power vias 130 can further provide electromagnetic shielding for the electronic component 20.

Figure 2B:
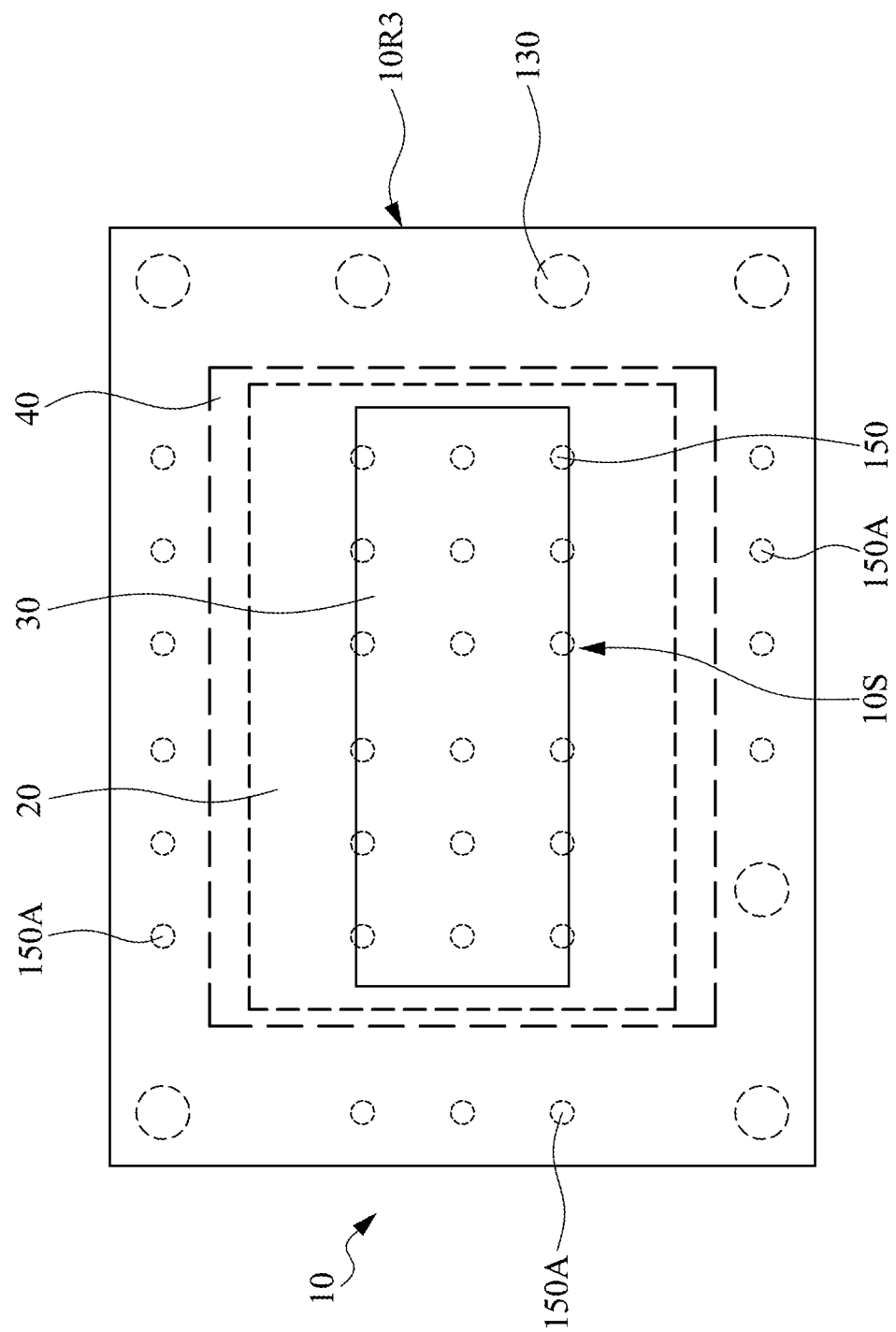
FIG. 2B is a top view of an electronic package in accordance with some embodiments of the present disclosure.

FIG. 2B is a top view of an electronic package 1 in accordance with some embodiments of the present disclosure. In some embodiments, FIG. 2B shows a top view of the electronic package 1 illustrated in FIG. 1. It should be noted that some elements are omitted from FIG. 2B for clarity.

In some embodiments, the signal routing region 10S includes non-power vias 150 and 150A. In some embodiments, the non-power vias 150A may be or include signal vias. In some embodiments, one or more non-power vias 150A are free from overlapping the electronic component 20 from a top view perspective. In some embodiments, the non-power vias 150A are located at a peripheral region with respect to the non-power vias 150. In some embodiments, the non-power vias 150A are not directly under the active surface 201 of the electronic component 20. In some embodiments, one or more non-power vias 150A may be disposed between adjacent two power vias 130.

Figure 2C:
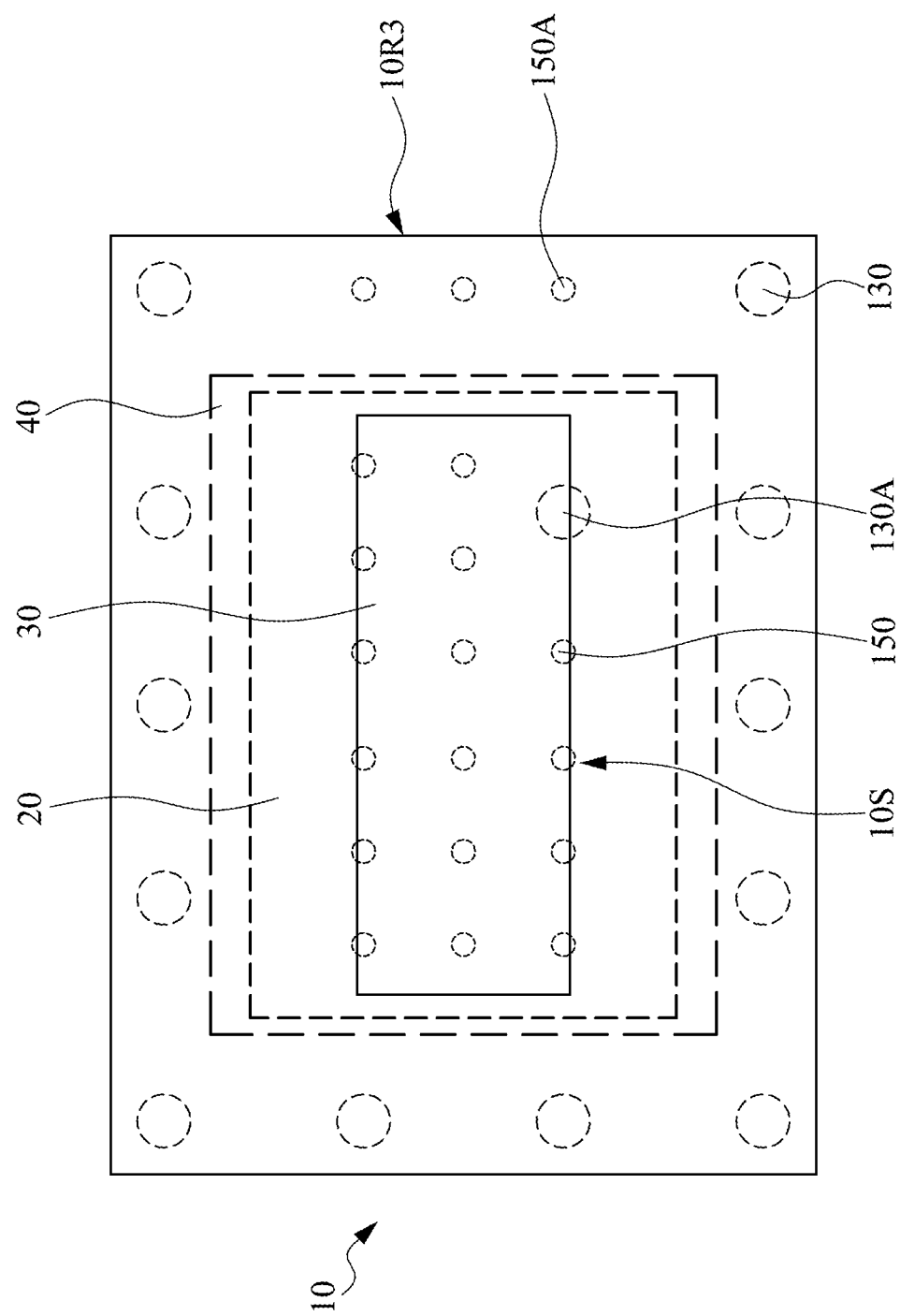
FIG. 2C is a top view of an electronic package in accordance with some embodiments of the present disclosure.

FIG. 2C is a top view of an electronic package 1 in accordance with some embodiments of the present disclosure. In some embodiments, FIG. 2C shows a top view of the electronic package 1 illustrated in FIG. 1. It should be noted that some elements are omitted from FIG. 2C for clarity.

In some embodiments, the portion 10R3 of the power routing region 10R includes power vias 130 and 130A. In some embodiments, one or more power vias 130A overlap the electronic component 20 from a top view perspective. In some embodiments, the power via 130A is located within a projection of the electronic component 20. In some embodiments, the power via 130A may be disposed adjacent to the non-power vias 150. In some embodiments, the power via 130A is disposed directly under the active surface 201 of the electronic component 20. In some embodiments, an additional grounding element may be further disposed between the power via 130A and the signal via 150 to reduce the possible interference between the power and the signal.

Figure 2D:
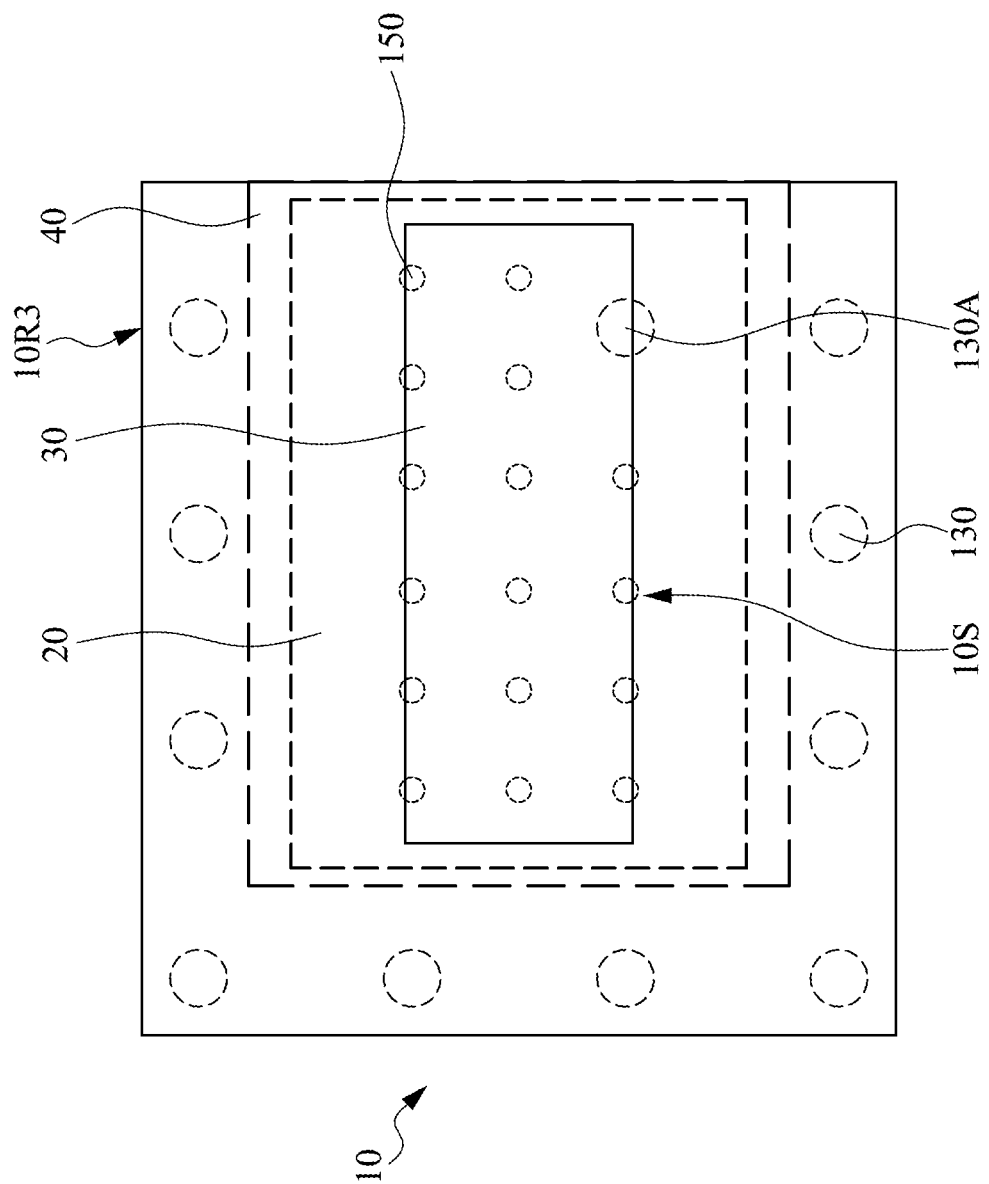
FIG. 2D is a top view of an electronic package in accordance with some embodiments of the present disclosure.

FIG. 2D is a top view of an electronic package 1 in accordance with some embodiments of the present disclosure. In some embodiments, FIG. 2D shows a top view of the electronic package 1 illustrated in FIG. 1. It should be noted that some elements are omitted from FIG. 2D for clarity.

In some embodiments, the power vias 130 may be disposed around a projection of the electronic component 20, and at least one side of the projection of the electronic component 20 is free from being adjacent to the power vias 130. In some embodiments, one or more power vias 130A may be further located within a projection of the electronic component 20. In some embodiments, the power via 130A is disposed directly under the active surface 201 of the electronic component 20. According to some embodiments of the present disclosure, one or some of the power vias (e.g., the power vias 130A) are disposed under the active surface 201 of the electronic component 20, which is advantageous to reducing the device area and increasing the flexibility of the layout design.

Figure 3A:
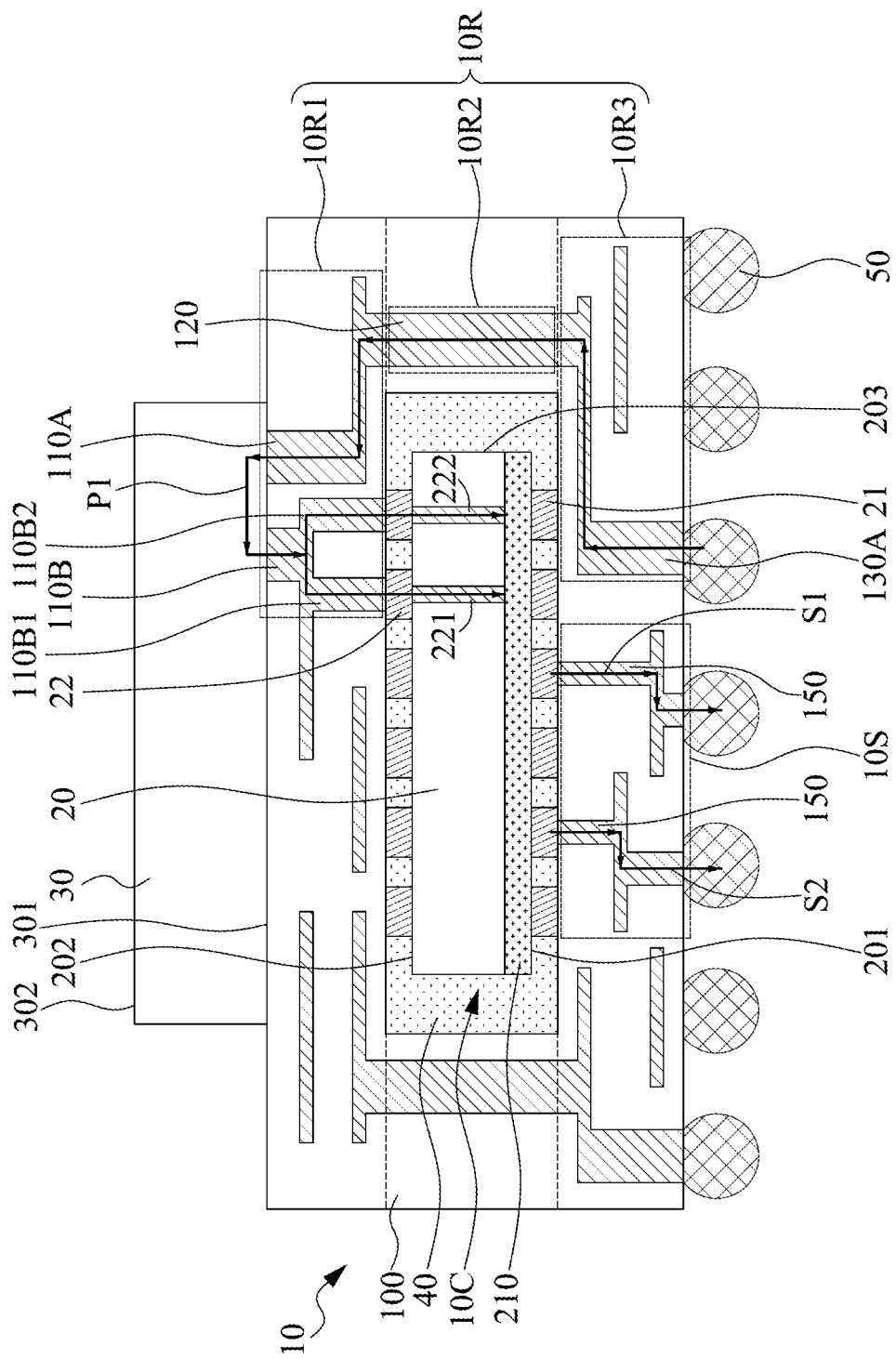
FIG. 3A is a cross-section of an electronic package in accordance with some embodiments of the present disclosure.

FIG. 3A is a cross-section of an electronic package 3A in accordance with some embodiments of the present disclosure. The electronic package 3A is similar to the electronic package 1 as shown in FIG. 1, with some of the differences therebetween as follows. Descriptions of similar components are omitted.

In some embodiments, the power via 130A of the power routing region 10R is directly under the active surface 201 of the electronic component 20. In some embodiments, the power path P1 of the electronic package 3A passes through the power via 130A, the power via 120, the power via 110A, the power regulating component 30, the power via 110B1 and/or 110B2, the passive surface 202 of the electronic component 20, the conductive through via 221 and/or 222, and then the active surface 201 of the electronic component 20

Figure 3B:
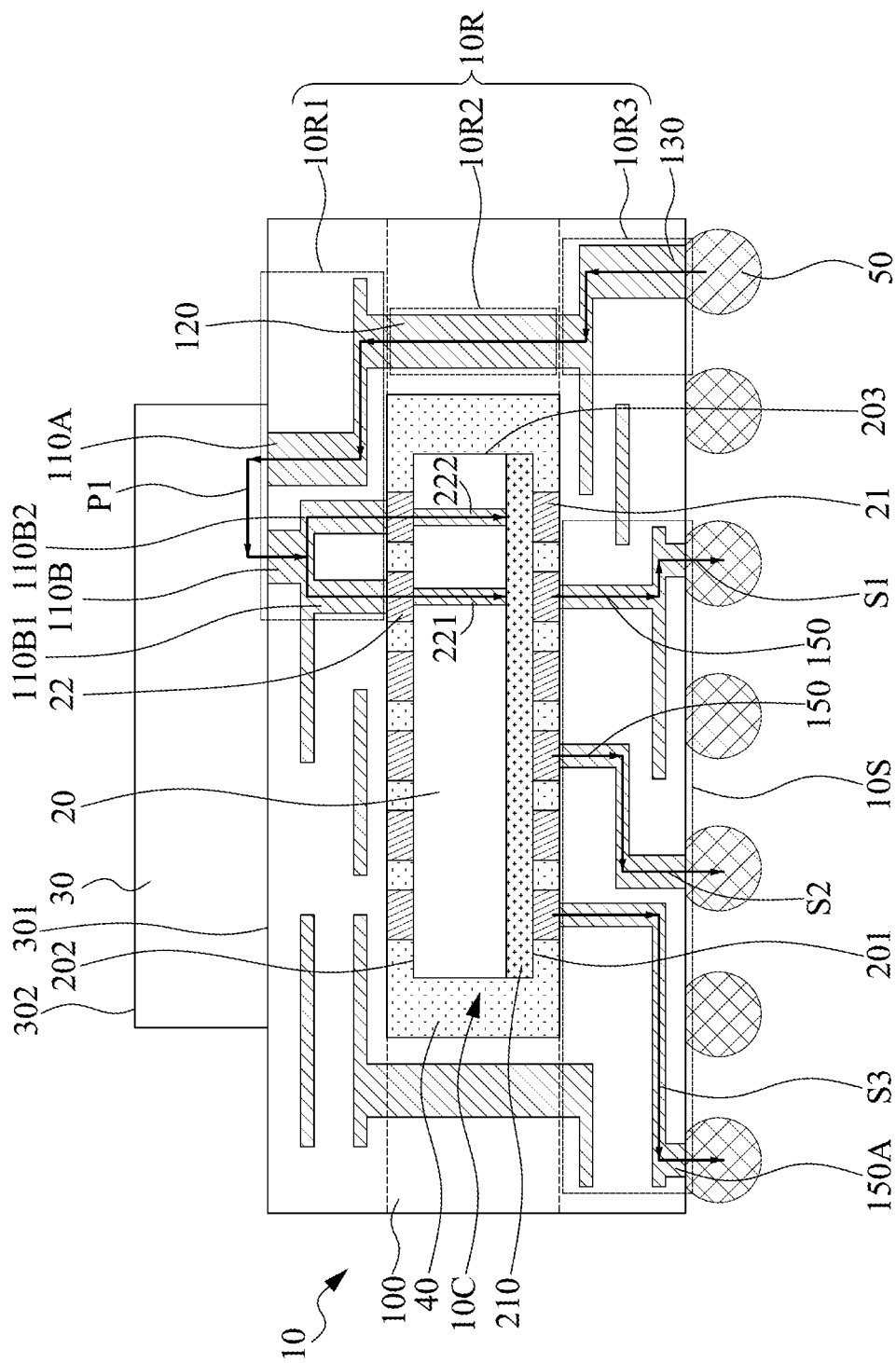
FIG. 3B is a cross-section of an electronic package in accordance with some embodiments of the present disclosure.

FIG. 3B is a cross-section of an electronic package 3B in accordance with some embodiments of the present disclosure. The electronic package 3B is similar to the electronic package 1 as shown in FIG. 1, with differences therebetween as follows. Descriptions of similar components are omitted.

In some embodiments, a portion of the signal routing region 10S is directly under the portion 10R2 of the power routing region 10R. In some embodiments, the signal via 150A is directly under the portion 10R2 of the power routing region 10R rather than directly under the active surface 201 of the electronic component 20. In some embodiments, in addition to the signal paths S1 and S2, another signal path S3 configured to transmit a signal to the carrier 10 and/or to receive a signal from the carrier 10 passes through the signal via 150A.

Figure 4A:
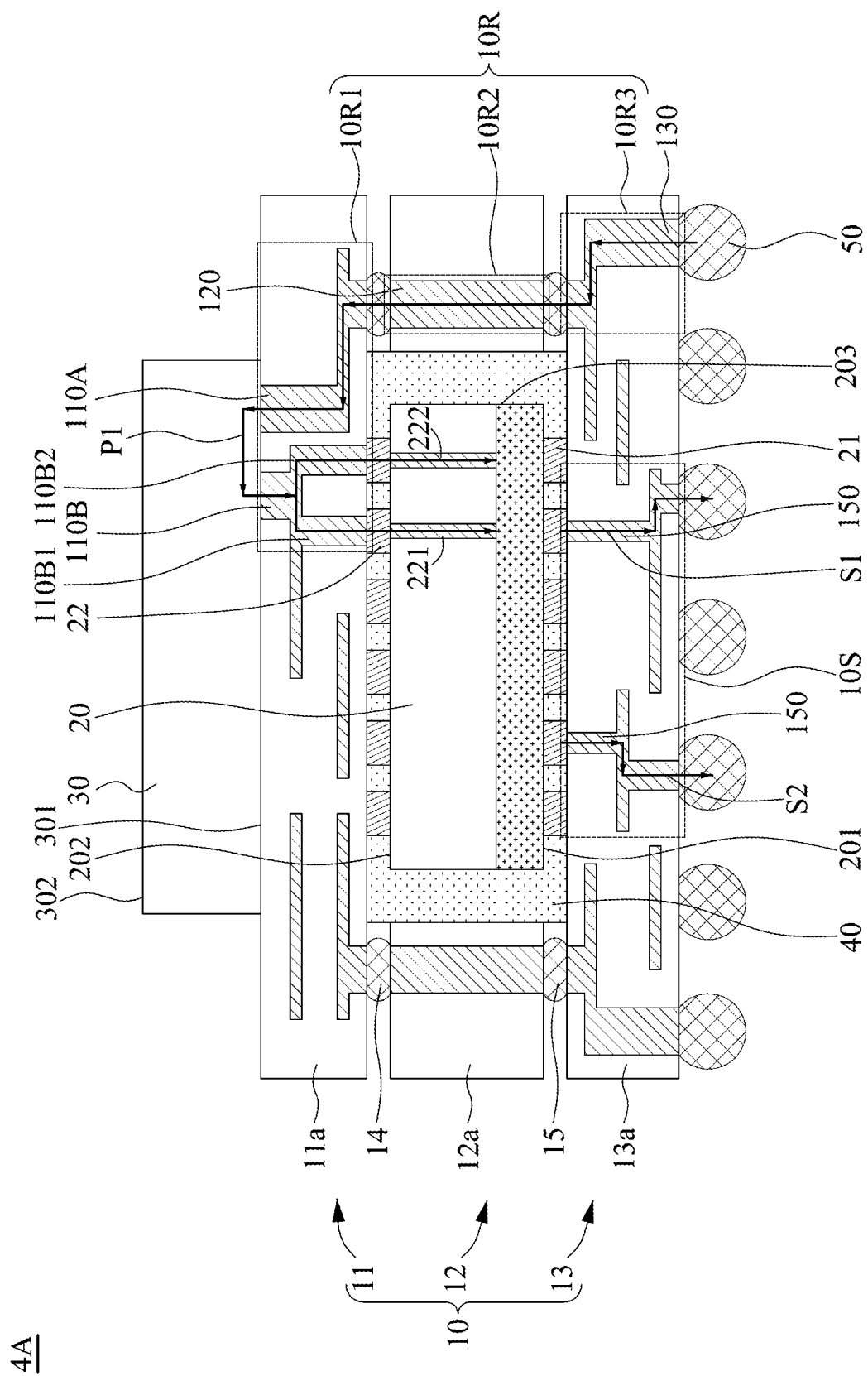
FIG. 4A is a cross-section of an electronic package in accordance with some embodiments of the present disclosure.

FIG. 4A is a cross-section of an electronic package 4A in accordance with some embodiments of the present disclosure. The electronic package 4A is similar to the electronic package 1 as shown in FIG. 1, with differences therebetween as follows. Descriptions of similar components are omitted.

In some embodiments, the carrier 10 includes a sub-carrier 11, a sub-carrier 12 connected to the sub-carrier 11, and a sub-carrier 13 connected to the sub-carrier 12. In some embodiments, each of the sub-carriers 11, 12, and 13 may include, for example, a printed circuit board, such as a paper-based copper foil laminate, a composite copper foil laminate, or a polymer-impregnated glass-fiber-based copper foil laminate. In some embodiments, each of the sub-carriers 11, 12, and 13 may include an interconnection structure, such as a plurality of conductive traces and/or a plurality of through vias. In some embodiments, each of the sub-carriers 11, 12, and 13 may include an organic substrate or a leadframe. In some embodiments, each of the sub-carriers 11, 12, and 13 may include a multi-layer substrate which includes a core layer and one or more conductive materials and/or structures disposed on an upper surface and a bottom surface of the sub-carrier. The conductive materials and/or structures may include a plurality of traces and/or vias. In some embodiments, each of the sub-carriers 11, 12, and 13 may include one or more conductive layers or structures (also referred to as "redistribution layers or structures" or "wiring layers or structures") and one or more dielectric layers or laminates stacked on each other.

In some embodiments, the sub-carrier 11 includes the portion 10R1 of the power routing region 10R, the sub-carrier 12 includes the portion 10R2 of the power routing region 10R, and the sub-carrier 13 includes the portion 10R3 of the power routing region 10R. In some embodiments, the sub-carrier 11 is electrically connected to the sub-carrier 12 through one or more conductive bumps 14. In some embodiments, the sub-carrier 12 is electrically connected to the sub-carrier 13 through one or more conductive bumps 15.

In some embodiments, the power vias 110A, 110B, 110B1, and 110B2 of the portion 10R1 are embedded in and penetrate a base layer 11a (e.g., including one or more dielectric layers or laminates) of the sub-carrier 11. In some embodiments, the power via 120 of the portion 10R2 is embedded in and penetrates a base layer 12a (e.g., including one or more dielectric layers or laminates) of the sub-carrier 12. In some embodiments, the power via 130 of the portion 10R3 is embedded in and penetrates a base layer 13a (e.g., including one or more dielectric layers or laminates) of the sub-carrier 13.

In some embodiments, the power path P1 passes through the portion 10R3 of the power routing region 10R, the conductive bump 15, the portion 10R2 of the power routing region 10R, the conductive bump 14, the portion 10R1 of the power routing region 10R, the power regulating component 30, the portion 10R1 of the power routing region 10R, the passive surface 202 of the electronic component 20, the conductive through via 221 and/or 222, and then the active surface 201 of the electronic component 20. In some embodiments, the power path P1 passes through the power via 130, the conductive bump 15, the power via 120, the conductive bump 14, the power via 110A, the power regulating component 30, the power via 110B1 and/or 110B2, the passive surface 202 of the electronic component 20, the conductive through via 221 and/or 222, and then the active surface 201 of the electronic component 20.

In some embodiments, the carrier 10 illustrated in FIG. 4A may be formed by the following operations. The sub-carrier 13 may be provided, and the sub-carrier 12 may be bonded to the sub-carrier 13 through the conductive bumps 15 and defining the cavity 10C. Next, after the electronic component 20 including the conductive pads 21 and 22 is encapsulated by the protective element 40 and then disposed on the sub-carrier 13, the sub-carrier 11 is bonded to the sub-carrier 12 through the conductive bumps 14 to form the carrier 10 illustrated in FIG. 4A.

Figure 4B:
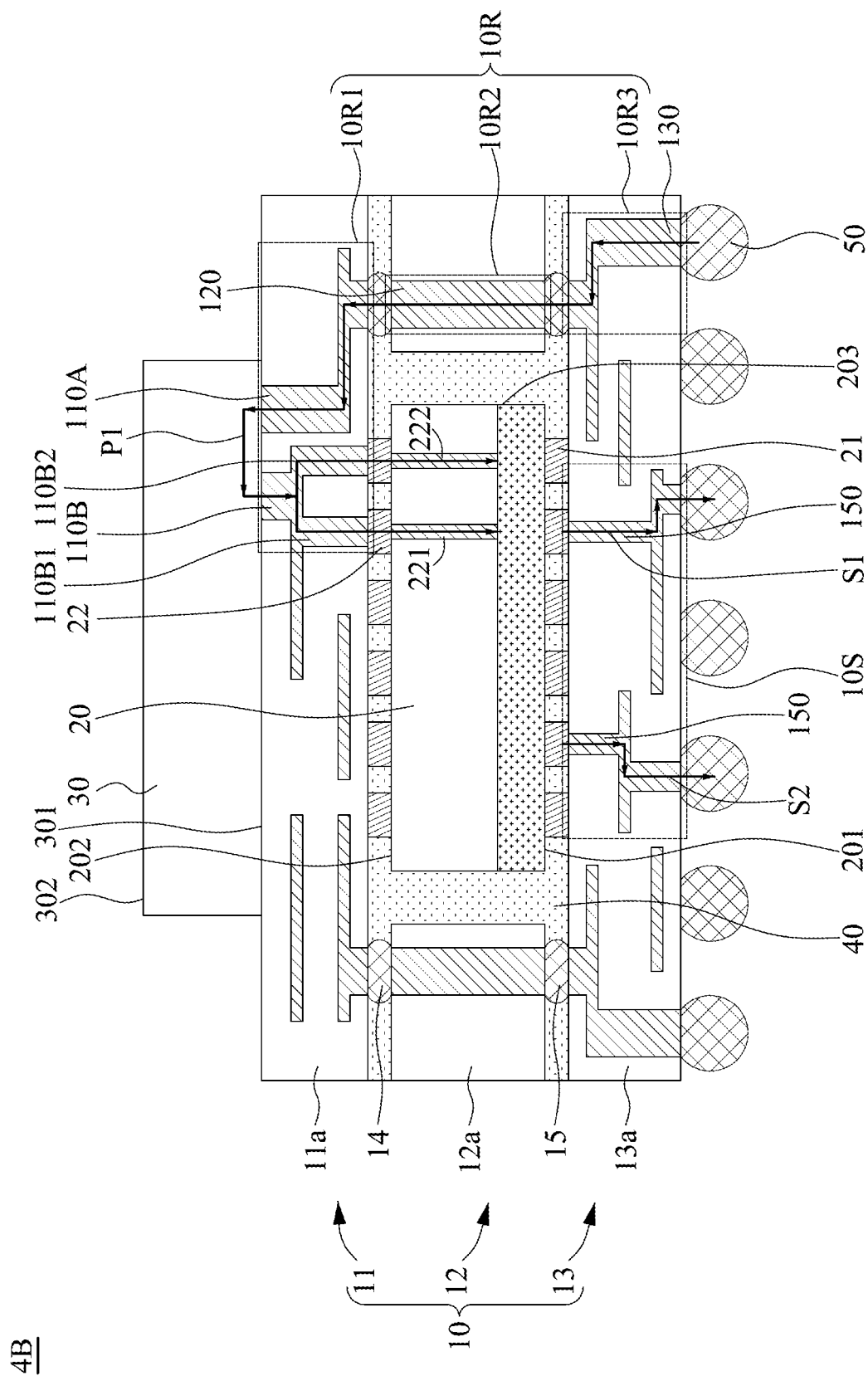
FIG. 4B is a cross-section of an electronic package in accordance with some embodiments of the present disclosure.

FIG. 4B is a cross-section of an electronic package 4B in accordance with some embodiments of the present disclosure. The electronic package 4B is similar to the electronic package 4A as shown in FIG. 4A, with differences therebetween as follows. Descriptions of similar components are omitted.

In some embodiments, a portion of the protective element 40 extends into one or more gaps between the sub-carrier 11 and the subcarrier 12. In some embodiments, a portion of the protective element 40 extends into one or more gaps between the sub-carrier 12 and the subcarrier 13. In some embodiments, the protective element 40 covers or encapsulates the conductive bumps 14 and 15.

In some embodiments, the carrier 10 illustrated in FIG. 4B may be formed by the following operations. The sub-carrier 13 may be provided, and the sub-carrier 12 may be bonded to the sub-carrier 13 through the conductive bumps 15 and defining the cavity 10C. Next, after the electronic component 20 including the conductive pads 21 and 22 is disposed on the sub-carrier 13 in the cavity 10C, the sub-carrier 11 is bonded to the sub-carrier 12 through the conductive bumps 14. Next, the electronic component 20 including the conductive pads 21 and 22 and the conductive bumps 14 and 15 are encapsulated by the protective element 40 to form the carrier 10 illustrated in FIG. 4B.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component. In the description of some embodiments, a component provided "under" or "below" another component can encompass cases where the former component is directly below (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An electronic package, comprising:
    a power regulating component;
    an electronic component; and
    a circuit structure separating the power regulating component and the electronic component;
    wherein the circuit structure is configured to provide a first power to the power regulating component, and the power regulating component is configured to provide a second power to the electronic component through the circuit structure; and
    wherein the electronic component comprises an active surface and a passive surface, and a power path from the power regulating component to the electronic component passes through the passive surface of the electronic component.

2. The electronic package of claim 1, wherein the circuit structure is located outside of an active surface of the power regulating component.

3. The electronic package of claim 2, wherein the circuit structure is located outside of the power regulating component.

4. The electronic package of claim 2, wherein the electronic component is embedded in the circuit structure.

5. The electronic package of claim 4, wherein the circuit structure comprises a first portion between the power regulating component and the electronic component, a second portion around the electronic component, and a third portion supporting the second portion and the electronic component.

6. The electronic package of claim 1, wherein the power path is configured to carry the first power, and the power path extends along a lateral side of the electronic component.

7. An electronic package, comprising:
    a power regulating component;
    an electronic component; and
    a circuit structure separating the power regulating component and the electronic component;
    wherein the circuit structure is configured to provide a first power to the power regulating component, and the power regulating component is configured to provide a second power to the electronic component through the circuit structure; and
    wherein the circuit structure comprises a cavity for accommodating the electronic component.

8. The electronic package of claim 7, further comprising a protective element encapsulating the electronic component.

9. An electronic package, comprising:
    a carrier comprising a plurality of non-power vias and a plurality of power vias around the non-power vias; and
    an electronic component over the non-power vias;
    wherein a portion of the power vias is over the electronic component and configured to provide a power to the electronic component through a passive surface of the electronic component.

10. The electronic package of claim 9, wherein the power vias extend along a lateral side of the electronic component.

11. The electronic package of claim 10, wherein the power vias are around the electronic component.

12. The electronic package of claim 9, wherein the carrier comprises a cavity for accommodating the electronic component.

13. The electronic package of claim 12, wherein the electronic component is fully embedded in the carrier.

* * * * *